US006416639B1

(12) United States Patent
De Bosscher et al.

(10) Patent No.: US 6,416,639 B1
(45) Date of Patent: Jul. 9, 2002

(54) EROSION COMPENSATED MAGNETRON WITH MOVING MAGNET ASSEMBLY

(75) Inventors: Wilmert De Bosscher, Drongen; Steven August Van Hove, Waregem, both of (BE)

(73) Assignee: Sinvaco N.V., Zulte (BE)

( * ) Notice: Subject to any disclaimer, the term of this patent is extended or adjusted under 35 U.S.C. 154(b) by 0 days.

(21) Appl. No.: 09/598,177

(22) Filed: Jun. 21, 2000

(30) Foreign Application Priority Data

Jun. 21, 1999 (EP) .............................................. 99870127

(51) Int. Cl.⁷ .............................................. C23C 14/35
(52) U.S. Cl. .............................. 204/298.2; 204/192.12; 204/192.13; 204/298.12; 204/298.22
(58) Field of Search ...................... 204/192.12, 192.13, 204/298.12, 298.2, 298.22, 298.23

(56) References Cited

U.S. PATENT DOCUMENTS

| 4,444,643 A | 4/1984 | Garrett ........................ 204/298 |
| 4,714,536 A | 12/1987 | Freeman et al. ............. 204/298 |
| 5,130,005 A | 7/1992 | Hurwitt et al. ......... 204/192.12 |
| 5,188,717 A | 2/1993 | Broadbent et al. ..... 204/192.12 |
| 5,328,585 A | 7/1994 | Stevenson et al. ....... 204/298.2 |
| 5,364,518 A | 11/1994 | Hartig et al. ........... 204/298.22 |
| 5,382,344 A | 1/1995 | Hosokawa et al. ...... 204/298.2 |
| 5,399,253 A | 3/1995 | Grünenfelder ........... 204/298.2 |
| 5,417,833 A | 5/1995 | Harra et al. ............. 204/298.2 |
| 5,507,931 A | 4/1996 | Yang ..................... 204/192.15 |
| 5,751,607 A | 5/1998 | Ohta .......................... 364/578 |
| 5,783,048 A | 7/1998 | Hurwitt ................. 204/192.12 |
| 5,830,327 A | 11/1998 | Kolenkow ............. 204/192.12 |
| 5,833,815 A | 11/1998 | Kim et al. ............. 204/192.12 |
| 5,876,576 A | 3/1999 | Fu ........................... 204/298.2 |

FOREIGN PATENT DOCUMENTS

| EP | 0 918 351 A1 | 5/1999 |
| WO | WO 96/21750 | 7/1996 |
| WO | WO 98/14631 | 4/1998 |
| WO | WO 99/26274 | 5/1999 |

OTHER PUBLICATIONS

H. Yamada, T. Shinmura, and T. Ohta; "A Sputter Equipment Simulation System Including Molecular Dynamical Target Atom Scattering Model"; *IEDM Tech. Dig.*, 1995, pp. 93–96.

H. Yamada, T. Shinmura, Y. Yamada, and T. Ohta; "Practical Monte Carlo Sputter Deposition Simulation with Quasi–Axis–Symmetrical (QAS) Approximation"; *IEDM Tech. Dig.*, 1994, pp. 553–556.

*Primary Examiner*—Steven H. Ver Steeg
(74) *Attorney, Agent, or Firm*—Jack V. Musgrove

(57) ABSTRACT

A magnetron including a target (2) for sputtering onto a substrate in described. The magnetron comprises a magnetic field generator (4) for generating a closed loop magnetic field adapted to generate a plasma race-track above the target (2) and a driving device for establishing relative substantially translational movement between the race-track and the target (2) and adapted to influence the magnetic field generated by the magnetic field generator (4) at least during part of the relative substantially translational movement, the distance between any point on the race track and the momentarily closest part of the one or more pieces (50) of ferromagnetic material varying in accordance with the relative substantially translational movement of the race-track and the target (2).

21 Claims, 7 Drawing Sheets

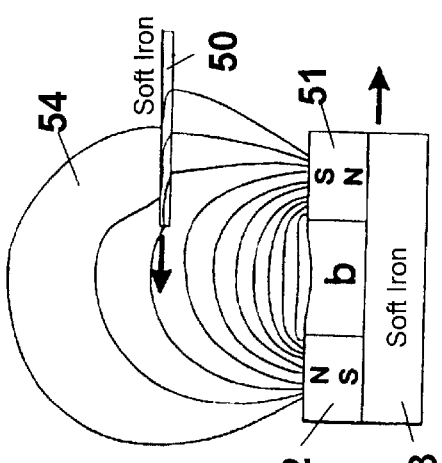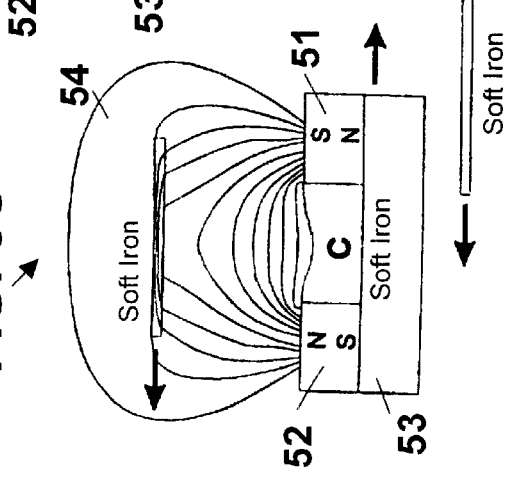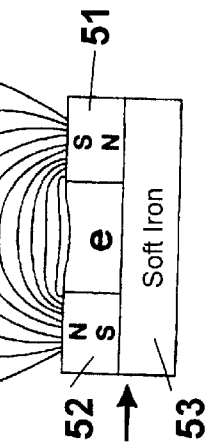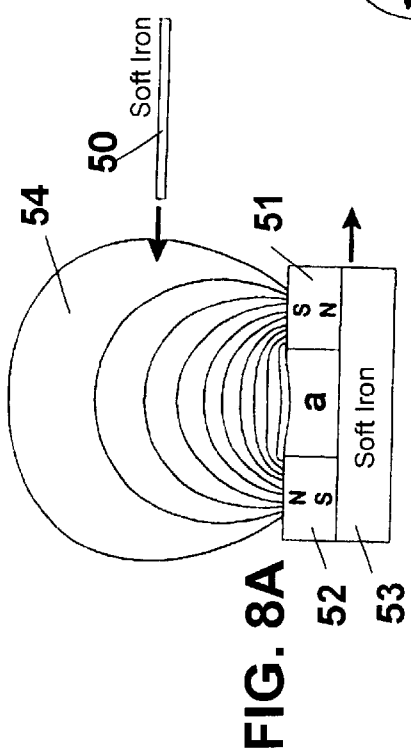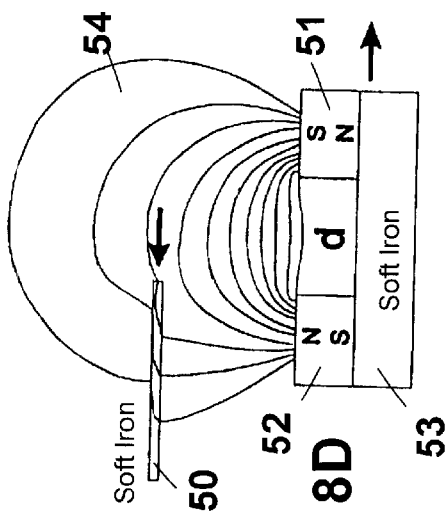
FIG. 8A  FIG. 8B  FIG. 8C  FIG. 8D  FIG. 8E
FIG. 8

EROSION COMPENSATED MAGNETRON WITH MOVING MAGNET ASSEMBLY

The present invention relates to a magnetron with a magnet assembly suitable for sputtering or reactive sputtering of materials from a cathode target onto a substrate as well as a method of operating the magnetron.

TECHNICAL BACKGROUND

There have been many attempts to improve the erosion profile of sputtering magnetron targets and/or deposition uniformity onto a substrate by moving a magnet array relative to the target. For example, a rectangular planar magnetron with a moveable magnet assembly is known from U.S. Pat. No. 4,444,643 in which the magnetic assembly is translated laterally and parallel to the major axis of the target, DE-A-27 07 144 proposes a magnet assembly which is swept over a rectangular target along a linear path, U.S. Pat. No. 4,714,536 proposes that the magnet assembly is moved with a non-repetitive epicycloidal motion combined with a translational motion over the target, i.e. the magnet array performs a non-repetitive small epicycloidal motion distributed over the area of the target, U.S. Pat. No. 5,188,717 explains that even erosion of the target can be obtained when the dwell time of the magnetic flux remains equal over each unit area of the target and proposes a specific shape to the magnet assembly, U.S. Pat. No. 5,382,344 describes a magnet assembly which produces electron paths in a plurality of race-tracks, the race-tracks are moved linearly and perpendicularly to the longest axis of the target with an oscillatory motion, EP-A-416 241 describes a magnet array which may be moved in an oscillating motion limited by the cathode tray, the motion being produced by a pin on a rotating cam, the pin being journalled in the base of the magnet array, U.S. Pat. No. 5,328,585 discloses a linear planar magnetron sputtering apparatus with a reciprocating magnet array, the reciprocating motion can be simultaneously lateral and longitudinal with respect to the cathode target, and U.S. Pat. No. 5,833,815 proposes reciprocating motions parallel to the substrate moving direction and at an angle thereto. A suitable motion of the magnet array may be determined by trial and error, by simulation, or simply by a good engineering guess. Whichever method is used actual target erosion may still show localised areas of preferential erosion where the magnetic flux resides for longer time per unit area than in other areas (dwell times) or areas where less of the target is eroded due to the fact that the magnetic flux has a localised shorter dwell time.

U.S. Pat. No. 5,417,833 discusses previous attempts to achieve uniform target erosion and points out that minor changes in the shape of the magnet array can lead to dramatic changes in erosion profiles. It is pointed out that it is difficult to marry actual magnetron results with strict mathematical analysis, the interaction of plasma with magnetic and electric fields not being a trivial problem. To improve the operation of the magnetron it is proposed to include not only a rotating magnet array but also a stationary electromagnet. A point on the racetrack generated by the magnetic field from the rotating magnet array always stays at the same distance from the electromagnet. Further, the teachings of U.S. Pat. No. 5,417,833 are related to a very special magnet array geometry and cannot be extended easily to other geometries and movements. The reason is that an electromagnet only produces a magnetic field in specific directions and/or at specific periodic times. However, a moving magnet array exerts at any one position on a target a magnetic field whose vector varies with time. Hence, it is necessary to compensate at any one position of the target for an imposed magnetic field having a varying vector, which generally will require a compensating field at this target position whose vector also changes. This is not easy with an electromagnet and hence, it is generally not possible to compensate for moving magnetic fields with changing magnetic field vector with an electromagnet particularly when the geometry of the magnet array and/or the motion of the magnet array is complex.

It is the object of the present invention to provide a sputtering magnetron with a moveable magnet array which is simple in construction, reliable and provides uniform target erosion.

Further, it is an object of the present invention to provide a simple erosion profile compensation device particularly for a planar magnetron.

It is a further object of the present invention to provide a moving magnet assembly which provides a high utilisation of the material of the target at least in a central region thereof.

It is still a further object of the invention to provide a method of operating a magnetron with moving magnet array so as to provide uniform target erosion.

SUMMARY OF THE INVENTION

The present invention provides a magnetron including a target for sputtering onto a substrate, the magnetron comprising: a magnetic field generator for generating a closed loop magnetic field adapted to generate a plasma race-track above the target; a driving device for establishing relative substantially translational movement between the race-track and the target; and one or more pieces of ferromagnetic material fixed with respect to the target and adapted to influence the magnetic field generated by the magnetic field generator at least during part of the relative substantially translational movement, the distance between any point on the race track and the momentarily closest part of the one or more pieces of ferromagnetic material varying according to the relative substantially translational movement of the race-track and the target. The one or more pieces of ferromagnetic material are preferably mounted close to the magnetic field generator. The movement produced by the establishing means may be repetitive re-entrant or repetitive non-re-entrant. The one or more pieces of ferromagnetic may be placed, according to one embodiment, at positions located so as to reduce excessive local erosion of the target. Alternatively or additionally, according to another embodiment of the present invention, the pieces may be placed at positions which reduce the rate of material sputtered from outside the target.

In the magnetron according to the present invention described above the magnetic field generator may be an array of permanent magnets or an electromagnet or electromagnets which move to create the race-track movement defined above. Alternatively, an array of stationary electromagnets may be used and the movement of the race-track may be produced by varying the magnitude and relative phases of the currents among the electromagnets of the array. The one or more pole pieces are preferably mounted close to the magnet generating means. The movement produced by the establishing means may be repetitive re-entrant or repetitive non-re-entrant.

The present invention also includes a method of operating a magnetron having a target and a magnetic field generator, comprising the steps of: generating a closed loop magnetic field using the magnetic field generator; generating a plasma race-track above the target using the generated closed loop magnetic field; moving the plasma race-track relative to the target; and locating one or more pieces of ferromagnetic material at positions stationary with respect to the target so that the magnetic field of the magnetic field generator is influenced at least during a part of the relative translational movement, the distance between any point on the race track and the momentarily closest part of the one or more pieces of ferromagnetic material varying according to the relative movement of the race-track and the target. The one or more pole pieces are preferably mounted close to the magnetic field generator. The movement of the race-track may be repetitive re-entrant or repetitive non-re-entrant. The one or more pole pieces may be placed, according to one embodiment, at positions located so as to reduce excessive local erosion of the target. Alternatively or additionally, and according to another embodiment of the present invention, the pole pieces may be placed at positions which reduce the amount of material sputtered from outside the target.

The present invention may also provide a method of improving target erosion of a sputtering magnetron, the sputtering magnetron having a race-track generator which generates a race-track which moves relative to a target, comprising the steps of: simulating the operation of the magnetron on a processing engine; determining from the simulation local areas of the target with excessive or reduced target erosion; simulating the effect of one or more pieces of ferromagnetic material fixed with respect to the target at locations neighbouring the local excessive or reduced erosion areas in the target; selecting a shape, thickness and material for the one or more pieces based on the results of the simulation in order to reduce the degree of excessive or reduced erosion of the local areas of the target. The processing engine may be a suitable computer such as a Personal Computer or a workstation.

The present invention also includes a method of improving target erosion of a sputtering magnetron, the sputtering magnetron having a race-track generator which generates a plasma race-track which moves relative to a target, comprising the steps of: inputting a description of the magnetron at a near location; transmitting the description to a remote processing engine running a magnetron simulation program; and receiving at the near location descriptions of one or more pieces of ferromagnetic material as well as locations for the fixing of these pieces stationary with respect to the target. The processing engine may be a suitable computer such as a Personal Computer or a workstation. Transmission between the near and far locations may be by suitable telecommunications networks, e.g. via the Internet. The processing engine may be connected to the telecommunications network by suitable modems. The simulation program may determine local areas of the target with increased target erosion, simulate the effect of one or more pole pieces of magnetically permeable material fixed with respect to the target at locations neighbouring the increased erosion areas of the target and select a shape, thickness and material for the one or more pole pieces based on the results of the simulation in order to reduce the depth of increased erosion areas of the target.

The present invention may provide the advantages of good utilisation of target materials while still providing a mechanically simple and reliable magnet assembly and drive.

The dependent claims define further embodiments of the present invention. The present invention, its advantages and embodiments will now be described with reference to the following drawings.

BRIEF DESCRIPTION OF THE DRAWINGS

FIGS. 8A to E show schematic representations showing the effect of a pole piece according to the present invention on the magnetic field strength.

DESCRIPTION OF THE ILLUSTRATIVE EMBODIMENTS

Figure 1A:
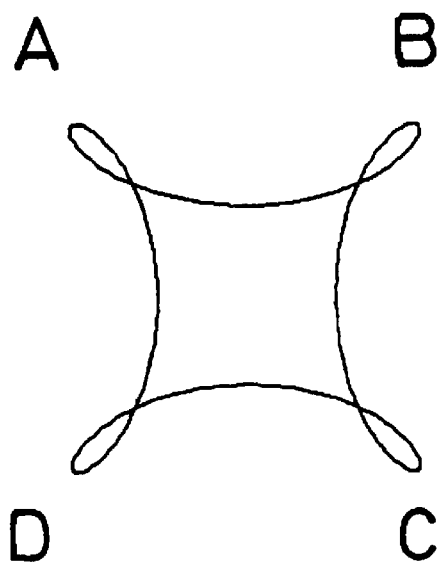
FIGS. 1a to 1d show schematic representations of movements according to an embodiment of the present invention.

The present invention will be described with respect to particular embodiments and with reference to certain drawings but the invention is not limited thereto but only by the claims. The drawings described are only schematic and are non-limiting. The present invention will mainly be described with reference to a planar magnetron however, the present invention is not limited thereto but may find advantageous use in any kind of sputtering magnetron, e.g. rotating cathode magnetrons, as defined in the appended claims.

As explained in the Int. patent application WO99/26274 the present inventor has determined surprisingly that certain advantages can be obtained in a planar sputtering magnetron with a rectangular target when the motion of the magnet assembly is repetitive rather than non-repetitive. Non-repetitive, i.e. non-re-entrant motions are also known for the movement of magnet arrays of sputtering magnetrons. The motion of the magnet array may be complex, e.g. epitrochoidal, epicycloidal, hypotrochoidal, hypocycloidal, circular or in the form of Lissajous figures. Whichever motion is used, experiment has shown that there can be local areas on the target at which the erosion is higher or lower than average. This may occur even when theoretical calculations indicate that the erosion should be uniform. The reason for this is that slight changes in magnet strength and/or position as well as small variations in translational motions may have a dramatic effect on erosion. Where the erosion is higher, the target must be changed earlier than necessary in order to avoid the backing plate underneath the target being sputtered once it has been exposed.

According to the present invention the problem of local variations of erosion depth caused by moving magnet arrays may be compensated by the use of one or more pieces of ferromagnetic materials which are fixed with respect to the target. For example, plate shaped pole piece(s) made from a magnetically permeable material, e.g. soft iron, may be placed so as to affect the magnetic field above the target in the region of the localised deviation in erosion depth. The advantage of a plate-like pole piece is that it has an effect on the magnetic field generated by the rotating magnet array according to the magnetic field vector, the effect not being subject to the same restrictions of magnetic field direction associated with an electromagnet.

As one non-limiting example, complex motions may be produced by a simple single drive mechanism which involves simple moving parts and requires a minimum of feedthroughs into the vacuum chamber as shown schematically in FIGS. 2 to 6. Magnet array motions which may be generally described as re-entrant epitrochoidal, epicycloidal, hypotrochoidal or hypocycloidal may be implemented with this device to provide useful uniformity of target erosion for planar magnetron targets having a generally polygonal, particularly rectangular form, e.g. square, oblong or parallelogram shape. The translational motion of the magnet assembly may be generated by a complex cycloidal movement described by the re-entrant trace of a non-slipping movement of a point on a first circle (or perturbation of a circle such as an ellipse, an oval or an egg shape) on the outer or inner periphery of a second circle (or perturbation of a circle such as an ellipse, an oval or an egg shape). Where both generators are circles, epitrochoidal or hypotrochoidal motions may be produced, of which epicycloidal or hypocycloidal motions are specific sub-classes of these. The translational relative motion of the magnet assembly with respect to the target may have the form of a two-dimensional figure. This figure may approximate epitrochoidal or hypotrochoidal motion and may be generated by other means (e.g. a computer controlled robot) than by mechanical means adapted to trace the locus of a point on a circle rolling without slipping on another circle.

Figure 1B:
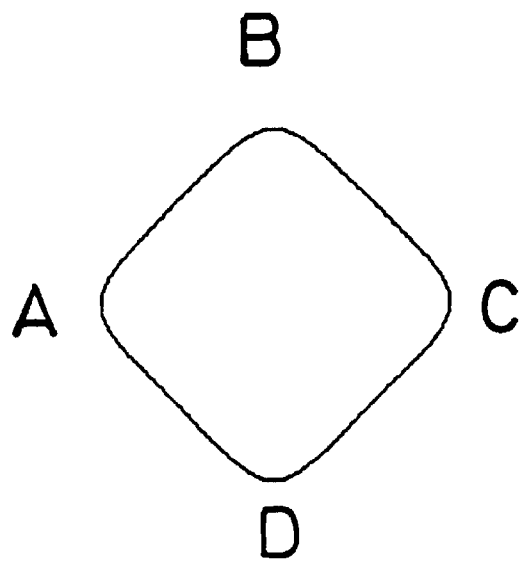
Figure 1C:
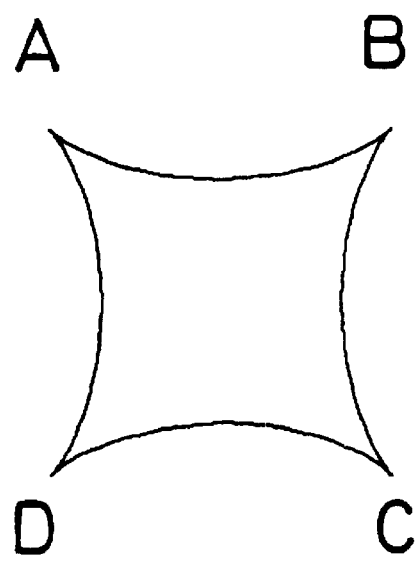
Figure 1D:
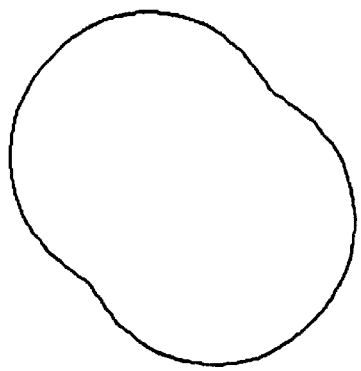

An epitrochoid or a hypotrochoid may be defined by three dimensions: a, b, h where b is the radius of a first circle which rolls without slipping around the outside (epitrochoid) or around the inside (hypotrochoid) of a second circle with the radius a. The dimension h is the distance from the centre of the first circle to the tracing point. If b=h, an epicycloid or a hypocycloid is generated. In FIGS. 1a to 1c, respectively, the traces of motions are in the forms of figures generated using a circle rolling on a circle. The shown hypotrochoids are generated by ratios of dimensions a:b:h as follows: FIG. 1a 1:3/4:7/13; FIG. 1b, 1:3/4:30/13; FIG. 1c, 1:1/4:1/4. The epicycloid of FIG. 1d has the ratios: 1:1/2:1/2. Ovals, ellipses, egg shapes or any other form of perturbation of a circle may be used as the generators of the translational figure determining the motion of the magnet assembly.

Preferably the preferred race-track motions do not move the sputtering parts of the race-track substantially over and beyond the edges of the target, at least in a substantially central region of the target where the substrate lies over the target. Keeping the race-track within the confines of the target in those parts of the target which are covered by the substrate avoids sputtering material from outside the target onto the substrate. Allowing sputtering outside the target places limitations on the materials which can be used flanking the target. One aspect of the present invention is directed to avoiding any such limitations or reducing their importance by keeping the race-track substantially within the target area at least in a central region of the target which lies under the substrate.

Figure 2:
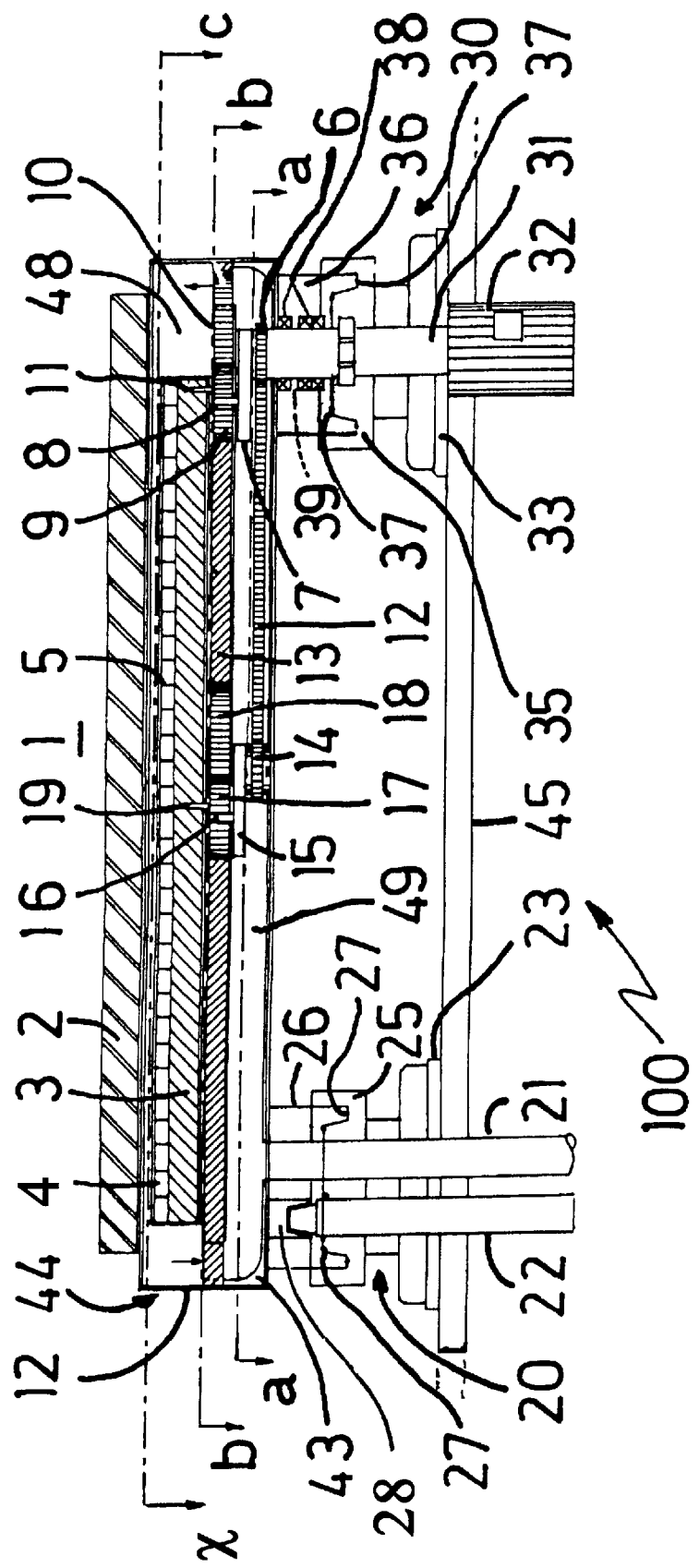
FIG. 2 shows a schematic representation of a cross-sectional side view of a sputtering magnetron according to the present invention.
Figure 3:
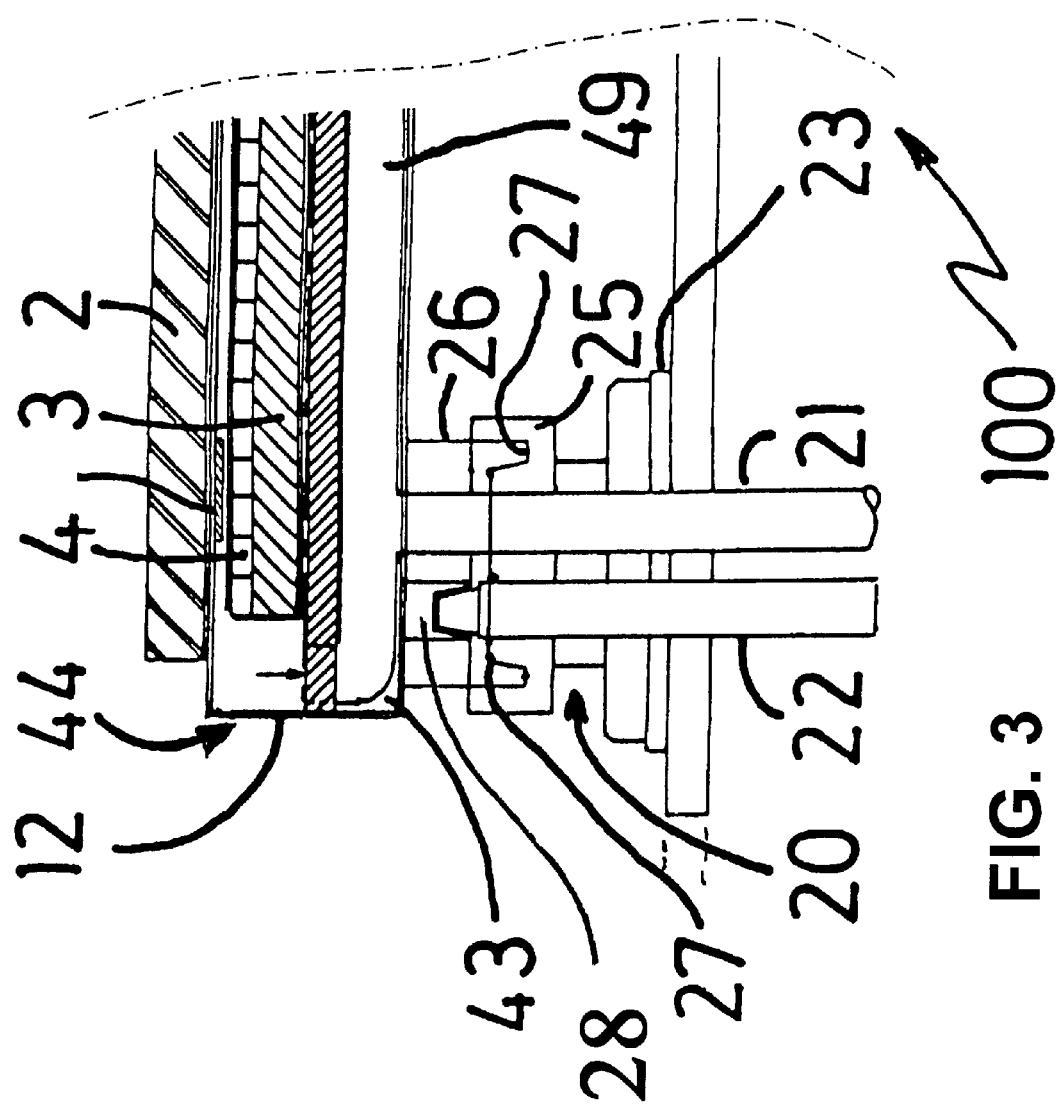
FIG. 3 shows an enlarged portion of the schematic representation of the magnetron of FIG. 2.

An embodiment of the present invention will be described with reference to FIGS. 2 to 6. FIG. 2 is a schematic longitudinal cross-sectional side view of a part of the planar magnetron sputtering device 100. This device 100 is used only to describe the present invention and is non-limiting. Any magnetron with relative motion between the magnet assembly and the target may make advantageous use of the pole pieces of the present invention. FIG. 3 is an enlarged view of the right hand portion of magnetron device 100 shown in FIG. 2.

A vacuum space indicated generally at 1 is defined by a vacuum chamber of which only a single vacuum wall 45 is shown. Within the vacuum space 1 an inert gas such as argon may be introduced when sputtering metals, or a mixture of an inert and a reactive gas such as oxygen or nitrogen may be introduced when sputtering compounds such as oxides or nitrides reactively. A planar target 2 is arranged to be supported on a main housing 44 parallel to a magnet assembly 4 which will be described later. Magnet assembly 4 is located in a movable housing 5 having a base 3 which is driven in a complex motion by pins 11 and 19, i.e. in this embodiment the motion is generally hypotrochoidal in form and lies in a plane parallel to the target 2. Base 3 is preferably a thick section of soft magnetic material which acts as a keeper for the magnets of magnet array 4 and improves the magnetic circuit formed by the magnet array 4, the base 3 and the air gap between the magnets of the magnet array 4.

Main housing 44 is supported by an end base 20, 30 at each end. End base 20 includes feedthroughs 21, 29, and 22 (29 is not visible in FIG. 2, best shown in FIG. 3) which provide a cooling fluid inlet 21, a cooling fluid outlet 29 and a high voltage feed-through 22 respectively. End base 30 includes a feed-through 31 which provides rotational driving power from a motor 32 to the pins 8 and 16 through a series of gears 9, 10; 17, 18 and via a timing belt 12 or similar. The driving power for 31 may be provided by an electric, pneumatic or hydraulic motor 32 or any other suitable rotational driving means. It is particularly preferred according to the present invention if the feedthroughs 21, 22, 29, 31 are generally of the type known from the end blocks of commercially available rotating cathode magnetrons.

End bases 20, 30 include upper and lower sealing units 26, 25; 36, 35 respectively which include at least one "O"-ring seal 27; 37 therebetween. Drive feed-through 31 includes a plurality of rotating seals 38 for sealing against leakage of cooling liquid from main housing 44. A leak detection pipe 39 may be provided between two of the seals 38 in order to warn of an impending major leak. End bases 20, 30 also include an insulating plate 23, 33 respectively to provide electrical isolation between the vacuum chamber wall 45 and the main housing 44. The high voltage feed-through includes a central conductor and outer insulation and provides electrical power to main housing 44 through a bushing 28.

Figure 4:
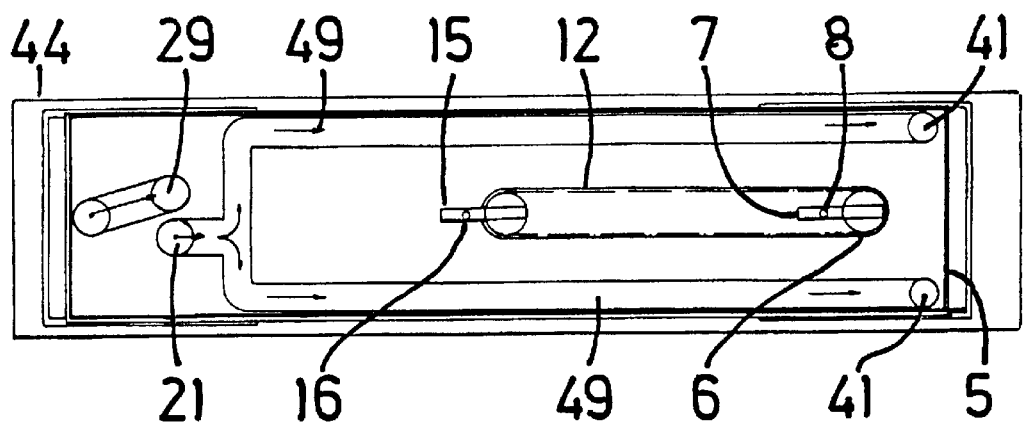
FIGS. 4 to 6 show further schematic representations of cross-sectional top views at different depths (levels a, b, c in FIG. 2) of a magnetron according to the present invention.
Figure 5:
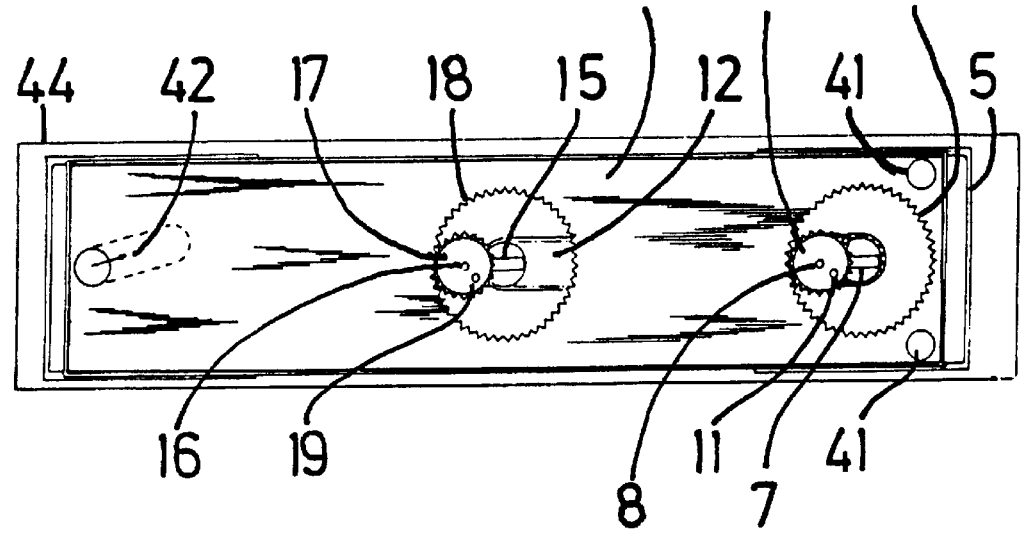
Figure 6:
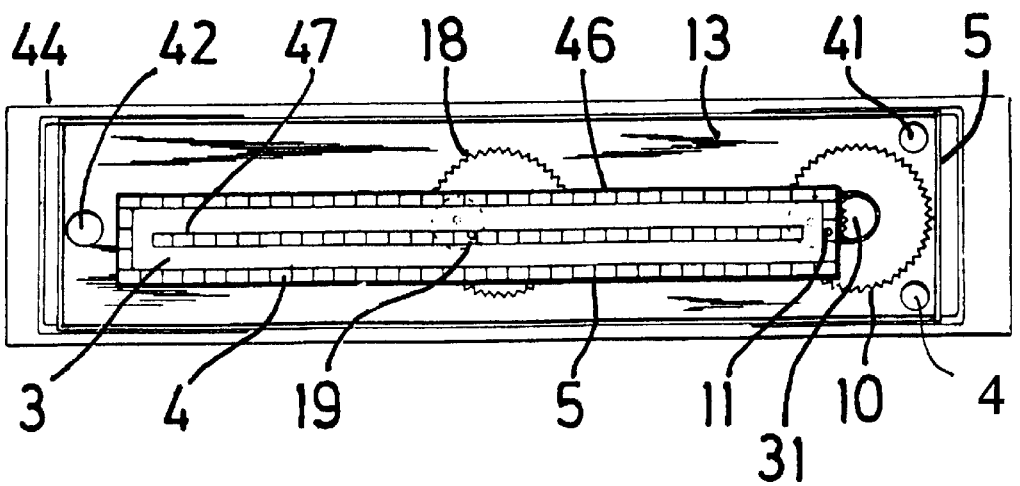

FIGS. 4 to 6 show various cross-sectional top-views at different depths of the main housing 44. FIG. 6 shows a general view from the top according to section c—c in FIG. 2. FIG. 5 shows a cross-section just above the plate 13 according to the section b—b in FIG. 2. FIG. 4 is a cross-sectional top view from just below the plate 13 according to the section a—a in FIG. 2. The magnet assembly 4 is located in the moveable housing 5 and is therefore generally protected from the cooling fluid. Magnet array 4 is preferably an elongate array which includes a central, relatively linear array 47 of high powered magnets, each magnet having one pole pointing vertically, e.g. the north pole. According to the present invention the housing 5 protects the magnet array 4 from the cooling liquid so that both corroding and non-corroding magnet types may be used. Suitable magnets are, for instance, high energy NdFeB magnets. Arranged around the inner array 47 is a closed loop 46 of similar high powered magnets, each of which has the opposite pole from the inner array 47 pointing upwards, e.g. the south poles. The magnets of the inner array 47 and the closed loop 46 may be a series of discrete magnets arranged in a line. The magnetic field generated between the magnets 46, 47 combined with the crossed electrostatic field around the target 2 creates a plasma loop usually known as a "race-track" immediately above the target 2. Located below the housing 4 is a fixed plate 13. In fixed plate 13, a central (18) and an end internal circular gear 10 are machined through plate 13. Internal gears 10, 18 may have different average radii but it is preferred according to the present invention if both the radii "a" of internal gears 10, 18 are the same. Internal circular gears 10, 18 may also have shapes which are perturbations of a circle, e.g. an ellipse, an oval, an egg shape or similar. Preferably, the internal gears 10, 18 are removable from plate 13 so that they may be interchanged with others having a different shape and/or radius and/or number of teeth. Internal gears 10, 18 may be located in inserts which fit into plate 13.

Within inner gears 10, 18, interchangeable cogs 9, 17 are constrained to move around the inner periphery thereof, supported on pins 8, 16 respectively. Cogs 9, 17 may optionally have different radii but it is preferred according to the present invention if the radii "b" of the cogs 9 and 17 are the same. Pins 8, 16 are driven around inside the inner gears 10, 18 by eccentrics 7, 15 respectively. Eccentric 7 is driven directly from the feed-through 31, whereas eccentric 15 is driven by a timing belt 12 or similar between gear 6 of feed-through 31 and gear 14 attached to eccentric 15. By setting the number of teeth on gears 6 and 14 and the position of the timing belt 12, the rotational speed and phase of eccentric 15 may be set to be the same or different from the rotational speed and phase of eccentric 7. It is preferred according to the present invention if the rotational speeds and phases of eccentrics 7 and 15 are the same. Movements of the magnet array 4 are then similar at the ends and in the middle thereof. Preferably, the shafts carrying gears 6 and 14 are securely journalled in the base of main housing 44 in such a way that they can be removed and replaced with other gears having a different diameter and/or a different number of teeth and/or a different shape.

Located on cogs 9 and 17 are drive pins 11, 19 respectively which are located in passing holes in the base 3 and drive the movable housing 5. Drive pins 11, 19 may be fixed within the circumference of cogs 9 and 17 respectively (the dimension "h" from the centre of cogs 9, 17 to the centre of drive pins 11, 19 respectively is then less than or equal to "b") or beyond the circumference on an extension (not shown, dimension "h" then being greater than "b"). As shown the housing 5 is cantilevered on the two pins 11, 19. According to the present invention slide blocks (not shown) may be provided to support the weight of the housing 5 and to eliminate the bending moment on pins 11 and 19 caused by the cantilever. Such slide blocks may, for instance, have a low frictional PTFE surface. These blocks do not need to provide any guiding function according to the present invention.

The cooling fluid, e.g. water, is pumped into the main housing through feed-through 21 and flows along two or more channels 49 towards the remote end of main housing 44, flows upwards through openings 41 in fixed plate 13 to an area 48 above and around the housing 5, returns to the other end of housing 44 and exits via the hole 42 in plate 13 and the feed-through outlet 29. While flowing back towards outlet 29, the cooling fluid floods the upper part 48 of the housing 44 and is in good contact with the underside of the support of target 2, thus providing efficient cooling of the target 2. The main housing 44 may be split into an upper (48) and lower (43) chamber separated by the plate 13. Preferably, the drives for the magnet array 4, i.e. the movement generators, are located in the lower chamber 43 and the magnet array 4 itself is located only in the upper chamber 48 so that the fluid flow in the upper chamber 48 is impeded only by the magnet array 4. Water may enter both the lower and upper chambers 43, respectively 48.

If it is desired to provide a dry main housing 44, the cooling liquid flow may be directed from the feed-through 21 to a cooling plate (not shown) to which the target 2 may be fixed. The cooling fluid passes through channels in the cooling plate and exits from the chamber via feed-through outlet 29.

Alternative methods of producing relative motion between the magnet array 4 and the target 2 are included within the present invention. For instance, instead of cogs 9, 17 following the inside of internal gears 10, 18, the cogs 9, 17 may be arranged to engage with the outside of external gears located in the same position as internal gears 10, 18 and journalled on shafts secured in plate 13. Pins 11, 19 then give the magnet array 4 an epitrochoidal or epicycloidal motion.

Figure 7:
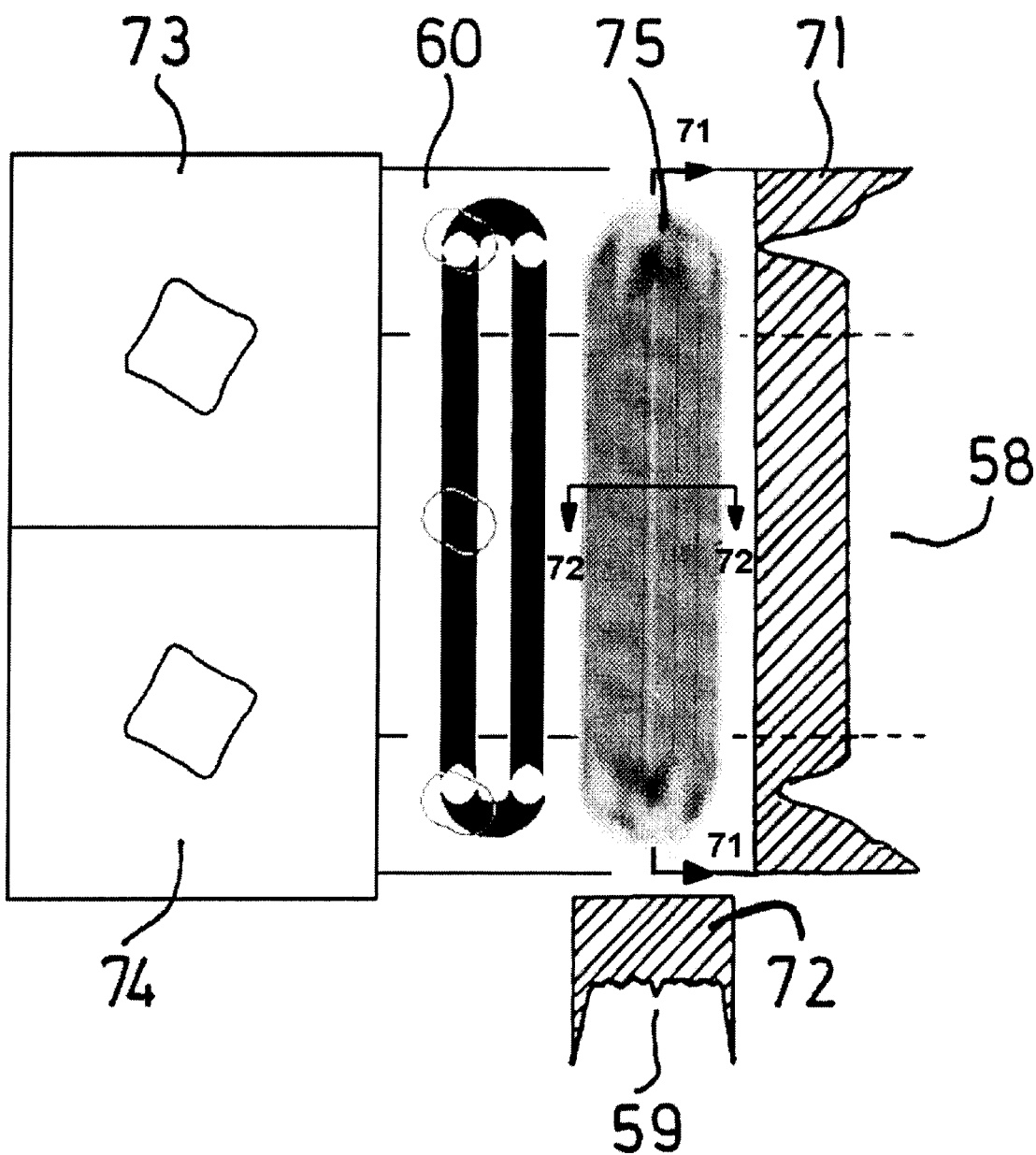
FIG. 7 shows a movement of the magnet assembly which may be used with the pole pieces according to the present invention and the resulting target erosion profiles parallel and perpendicular to the major axis of the race-track without the pole pieces.

According to one embodiment of the present invention a central portion of the target 2 can be sputtered with a substantially uniform erosion profile by suitable selection of magnet assembly shape and motion. However, increased erosion may occur at certain positions on the target, e.g. at the ends of a long rectangular target. Even when these end pieces are eroded with a poor average yield, the average erosion of the complete target may still be high. For the target, the uniformity of erosion profile according to the present invention may be represented by the ratio of the average erosion to the peak erosion. By peak erosion is meant local maxima or minima of erosion, i.e. either too much erosion compared with the average or too little. For perfectly uniform erosion this ratio would be 100%. If the peak erosion within the central region is 100% the target is eroded completely through. If the peak erosion in the central region is Y% and the average erosion in the central region is X%, then the uniformity ratio according to the present invention is X/Y×100%. An example of such a motion is shown in FIG. 7. This motion was produced by a planar magnetron with the movement of the magnet array produced by the device shown schematically in FIGS. 2–6. The length "l" and width "w" of the target were 450 and 110 mm, respectively. The magnet array movement was hypotrochoidal with the dimensions "a"=1, "b"=¼ and "h"=⅛. The width "s" of the track of the race-track is defined as the distance in which 95% of the energy of the race-track is concentrated. In this example it is 14 mm. The distance "t" across the minor axis of the race-track between the centres of the tracks is 48 mm and the length "r" of the major axis of the race-track is 372 mm. The sideways movement of the magnet array, i.e. perpendicular to the longitudinal axis of the race-track, was 88% of the dimension "t". The motion is a modified square which is tilted with respect to the axis of the target. The target consumption over the relatively long central portion of the target was just under 50% with an average for the complete target of about 38%. The uniformity ratio of the central portion was over 80%. No sputtering outside the target was encountered. The target erosion profiles 58, 59 parallel and perpendicular to the main axis of the race-track at the centres thereof, respectively are represented in sections 71 and 72 respectively. The motion of the motion generator 7–11 is given at 74 and for the generator 15–19 at 73. A pictorial view of the depth of erosion (depending upon grey scale) is given at 75. Two peaks of erosion are noticeable at each end of the race-track. In the middle of the target 2 the erosion is extremely uniform.

According to an embodiment of the present invention the excessive depth of erosion local to the ends of the target 2 are removed or at least partly eliminated by the use of soft magnetic pole pieces 50 as seen best in FIG. 3. For instance, according to the present invention two or more pole pieces 50 may be introduced between the magnet array 4 and the target 2 located at positions at which the target 2 experiences the peak erosions such as those visible in section 71 of FIG. 7. These pole pieces 50 may be flat plates of varying thickness (e.g. tapered towards the outside circumference thereof) and may be fixed stationary with respect to the target 2, e.g. to the upper underside surface of the main housing 44. Pole pieces 50 may be made of or may contain any ferromagnetic material, e.g. a suitable soft magnetic material such as soft iron, mild steel. The pole pieces 50 preferably have an atomic susceptibility of at least 1.

Extremely high target consumption efficiencies are possible if stationary pole pieces 50 are introduced between the target 2 and the moving magnet array 4 at those portions of the target 2 where there is local excessive erosion which is determined by an effect of the magnet array motion, e.g. either by slower movement of the magnet array at this point or by multiple exposure to the same part of the target 2 to the magnetic field of the magnet array 4, e.g. when the same spot on the target 2 is traversed by several parts of the magnet array 4. By using appropriate shapes and thicknesses of pole pieces 50 the excessive erosion can be reduced or substantially eliminated locally without affecting the rest of the erosion behaviour on the target 2. As the pole pieces 50 are stationary with respect to the target 2, they only affect the magnetic field produced by the magnet array 4 when this array is underneath the pole piece 50. The action of the pole piece 50 will be explained with reference to FIGS. 8A to 8E. FIG. 8A shows two magnets 51 and 52 of the magnet array 4 separated by a gap so that a magnetic field 54 is generated in the space between and above them. The magnetic circuit provided by the magnets 51, 52 may be partially completed by a soft magnetic keeper 53, e.g. from soft iron. A pole piece 50 according to the present invention lies outside the majority of the magnetic field 54 and therefore has little effect. As shown in FIG. 8B the magnet array 4 has moved so that it is partly underneath pole piece 50 which acts as a "magnetic shunt", i.e. it tends to short circuit magnetic lines of force thus reducing the magnetic field above the magnets 52, 53 which generates the plasma above the target 2. As shown in FIG. 8C, the pole piece 50 lies well within the magnetic field 54 and produces a more or less symmetrical reduction in the magnetic field strength in the area above the pole piece 50. FIG. 8D shows the situation as the magnet array 4 has moved until pole piece 50 has almost left the magnetic field 54 and FIG. 8E shows the pole piece 50 well away from the magnets 51, 52. The properties of the soft magnetic pole pieces 50, e.g. thickness and magnetic characteristics of the material should be chosen in order to affect the magnetic field in such a way as to reduce the local excessive erosion. A more severe erosion effect should be compensated by a larger magnetic shunt. This may be achieved by using an appropriate material or by adjusting the plate thickness or pole piece 50. The magnetically permeable pole pieces 50 may be located between the magnet array 4 and the surface of the target 2; e.g. encapsulated in the back surface of the target 2, or located at the top surface of any cooling backing plate placed below the target 2, or positioned between the target cooling plate and the magnet array. The presence of a plate-shaped pole piece 50 with properly adjusted thickness and magnetic characteristics may have an adequate effect on the movement of the electrons in the magnetic bottle which holds the plasma in place. For a non-perturbed magnetron configuration, the cyclical repeat distance or hopping distance of the electrons in the plasma is typically in the order of mm (both in height and width). This means that the effect of the pole piece 50 (typical tens of mm in diameter) will be seen by the electrons. At the moment that a slightly lower magnetic field is encountered, the hopping distance of the electrons becomes larger. If an electron has an ionising collision with a gas atom, the ion has to be accelerated towards the target surface. Since the ion can only be accelerated towards the target over the cathode dark space, the chance of having an ion that contributes to the sputtering of the target is larger when the ion is formed closer to the target surface. Hence, the sputter yield for a fixed chamber pressure and target voltage is larger for a higher magnetic field parallel to the target surface. A local slightly reduced magnetic field will correspond with a local lower erosion rate of the target 2.

If there is too little erosion of the target 2 locally, the pole pieces may also be placed below the magnet array, i.e. on the remote side from the target 2. In this case the magnetic circuit between the magnets of the magnet array is improved and thus the magnetic field above the target is increased. It is a specific embodiment of the present invention to design the keeper 3 so that the magnetic circuit between the magnets of the magnet array is restricted by the magnetic susceptibility of the keeper 3 so that the addition of a pole piece 50 below the magnet array may have a significant effect on the change in magnetic field above the target 2.

The effect of the pole pieces 50 according to the present invention is as follows. If during the sputtering process the magnet array 4 is not located near to a pole piece 50, the standard race-track will exist and normal erosion will occur. If however at another moment during the periodic movement of the magnet array 4 a part of the race-track is influenced by a pole piece 50, both the magnetic field strength and the resulting erosion rate will be locally changed. Hence, according to the present invention, the distance between a point on the race-track and the closest part of the pole piece 50 at that moment of time varies with a periodicity equal to that of the movement of the magnet array, and hence the race-track, relative to the target. Since the pole pieces 50 may be exactly shaped and positioned to compensate for the faster local erosion of the target 2 due to longer dwell times (longer residence time of the same magnet array or more passes of the magnet array over the same target area), the deviations in target erosion depth may be reduced and even eliminated. An equal erosion over a large target area may be obtained according to the present invention without the need of intermediate replacement of portions of the target, e.g. end portions of the target 2. In this way, the lifetime of a single piece target 2 may be extended significantly due to a more uniform utilisation of the complete target and due to the removal of any local "hot spots".

According to a further embodiment of the present invention a method of determining the shape and thickness of pole pieces 50 is provided. Methods of simulating the erosion of a target given a magnet array shape and magnet strengths are known, e.g. the methods described by H. Yamada et al. in the article "Practical Monte Carlo Sputter Deposition Simulation with quasi-axis symmetrical (QAS) approximation", Internal Electron Device meeting of IEEE, San Fransisco, 1994-12, pp 553–6; "A sputter equipment simulation system including molecular dynamical target atom scattering model" by Yamada et al., IEEE Electron Device meeting, 1995 Technical Digest, pp 4.5.1–4.5.4; U.S. Pat. No. 5,751, 607; WO 98/14631. In a first method step a description of the magnetron details are input to a suitable computing device, e.g. a PC running a program based on the simulation method known from one of the above. The details would include strengths of the magnets making up the magnet array, shape and size of the magnet array, electrical and magnetic properties of the keeper, distance of the magnet array from the target surface, electrical and magnetic properties of the target material, speed and trace of the movement of the magnet array, electrical field distribution, presure and species of gas or gasses in the sputtering chamber, etc. Based on this input descriptor file, the computer calculates the expected erosion profile. If the simulated erosion profile includes local high erosion (=hot spots), pre-determined numbers, shapes and thicknesses of pole pieces may be added into the description of the magnetron and the erosion profile simulation program re-run on the computer. To automate the process, a target erosion uniformity may be entered into the computer and the program selects one pre-determined pole piece after another and determines the erosion profile with the associated erosion uniformity for each pole piece in a plurality of positions around the centre of the excess erosion. After all the pole pieces and positions have been used in the calculation, the computer generates a list of all the pole pieces with the associated positions which satisfy the erosion uniformity requirements. The computer program may also be adapted to calculate shapes and sizes of pole pieces based on the dimensions of the excess erosion such as the size and depth, as well as to calculate suitable positions of the pole piece based on the position of the excess erosion with respect to the target. Once a pole piece has been found which meets the uniformity requirements, this may be manufactured according to the dimensions determined by the computer program and fixed at the correct position below the target determined by the computer program.

In a further embodiment of the present invention the simulation program is located on a server to which access may be obtained by suitable means, e.g. the Internet. A user of the program on the server, enters a descriptor file at a remote location of a magnetron with descriptions of a magnet array and movement. The descriptor file is transmitted to the server via the Internet and the erosion profile simulation program on the server operates on the descriptor file and generates pole piece dimensions, numbers and locations which meet the required erosion uniformity requirements. These pole piece dimensions are returned to the remote location, via suitable means, e.g. fax, e-mail or directly via the Internet.

In yet a further embodiment, a magnetron may be operated with the proposed target and magnet array and movement and the erosion profile determined empirically. Once the excess erosion spots are known, the method includes the steps of measuring the depth of local deviations in target erosion, calculating the acceleration factor with respect to the uniform eroded area, construction and fixing of appropriate pole pieces with respect to the target. For example, for target made of refractory materials, a soft magnetic material such as iron may be cast in a molten form on the target in the local high erosion areas to form a pole piece with a shape dictated by the actual shape of the local high erosion areas. These cast pole pieces may be fixed relative to the target at a position conterminous with the local excessive erosion but on the side of the target remote from the local excesive erosion.

Figure 9A:
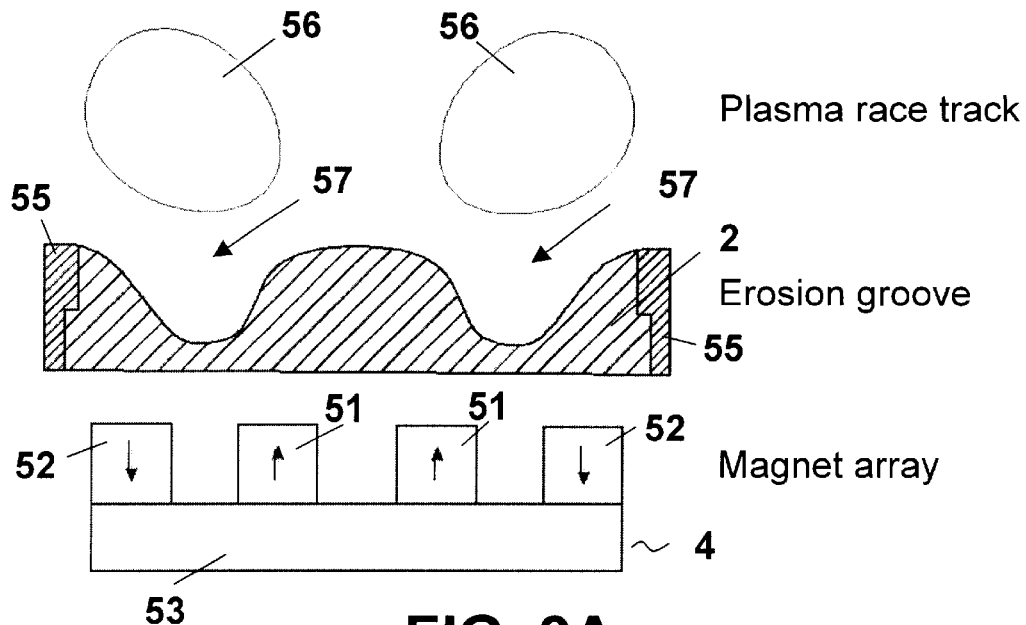
FIGS. 9A and B are schematic representations of a device for compensation of target erosion according to another embodiment of the present invention.
Figure 9B:
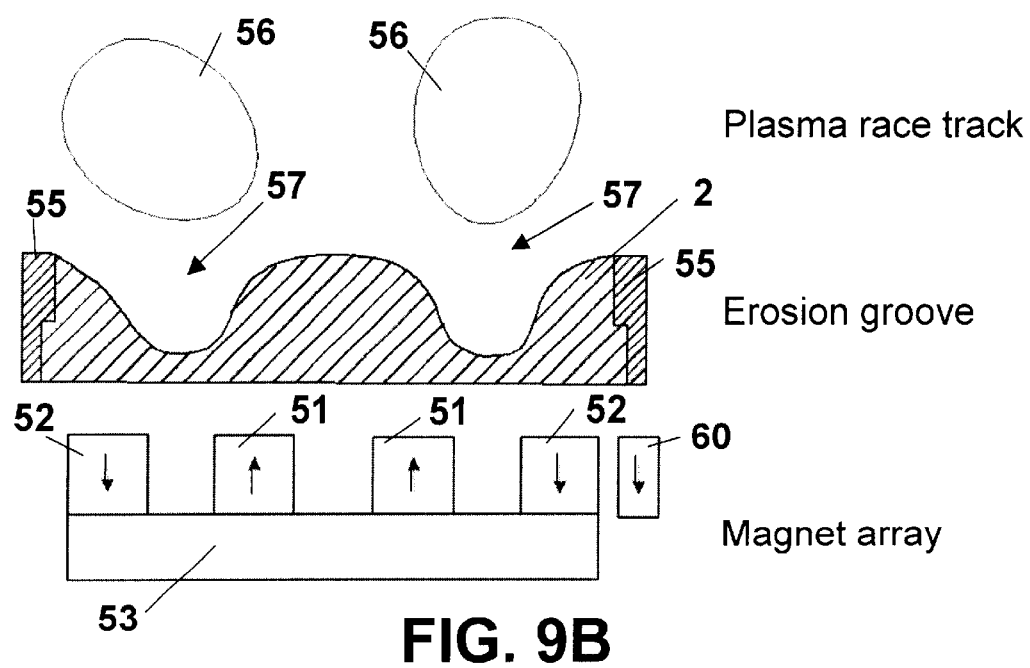

According to a further embodiment of the present invention a further improvement may be obtained by the use of pole pieces fixed with respect to the target 2. In order to obtain high target utilisations it would be preferred to have very steep walls to the erosion groove. As shown in portion 72 of FIG. 7, the erosion groove in a central portion of target 2 is almost completely uniform with steep walls at the edges. The plasma produced above the target by the magnet array 4 is not perfectly sharp, hence, there is a trade-off between the thickness of the outer walls of the eroded target 2 and the amount of sputtering outside the target area. Sputtering outside the target area means that some material outside the target 2 may be sputtered onto the substrate. To reduce this type of sputtering a material such as titanium which is difficult to sputter may be used to protect the edges of the target 2. This is shown schematically in FIG. 9A. Magnets 51, 52 are arranged on a soft magnetic keeper 53 in a magnet array 4 in the form of a closed loop and generate a plasma race-track 56 above a target 2. The magnet array 4 may be provided with a motion which brings it close to the clamping walls 55 of the target 2. These walls 55 may be made of titanium, for example. At a position of maximum movement of the magnet array 4 towards one of the walls 5, some sputtering occurs on the walls 55. As these are made of titanium, the amount of sputtered titanium is small. However, in some applications even the use of titanium may introduce an unacceptable contamination. In such circumstances the motion of the magnet array 4 may be reduced so that the plasma race-track stays well away from the target edges. This results in thicker outer walls to the eroded target and therefore to a lower target utilisation. According to this embodiment of the present invention magnets 60 are placed along the periphery of the target 2 and fixed with respect thereto so that when the magnet array 4 approaches these magnets 60 the magnetic field at the surface of the target 2 is distorted and hence the plasma race-track 56 is also distorted as shown schematically in FIG. 9B. As shown, the magnet 60 has the same polarity as the magnet 52 of the magnet array 4 which comes closest to it. This causes the lines of force to bend more steeply towards the magnet combination 52, 60. This tightening of the lines of force close to the magnet combination 52, 60 causes the erosion profile 57 of the target 2 to be steeper on the side facing towards the magnet 60 thus reducing the sputtering rate from any material just outside the target 2.

The moving magnet assembly 4 with the addition of pieces of ferromagnetic material according to the present invention may advantageously be used in reactive sputtering in which a reactive gas is introduced into the vacuum chamber, e.g. nitrogen or oxygen in addition to an inert gas such as argon. Reactive sputtered coatings are compounds, e.g. nitrides or oxides and are usually electrical insulators. During the sputtering, any surface portions of the target which are coated with the compound material become insulated and are charged with positive ions. The coating generally sputters at a very much lower rate than the pure metal. This is known as target poisoning. When the charge reaches a certain level arcing with the plasma race-track can occur resulting in serious damage to the target and/or the substrate and the deposition process is halted as all the energy goes into the arc. The problem is discussed in U.S. Pat. No. 5,507,931 for instance.

According to the present invention, the movement of the magnet assembly across almost the complete surface of the target prevents excessive build up of compound layers on the target by sputtering these to the substrate. As a result arcing is effectively eliminated.

The present invention may be used to advantage with AC switching of the targets during reactive sputtering. In this procedure two targets are placed close to each other and the target voltage is not a constant DC voltage but is rather an AC voltage, e.g. a sinusoidal or square wave, whereby the phase of the voltage for the two targets is 180° out of phase. When the one target is at negative potential the other target is at a positive potential. Only the target with a negative potential sputters to the substrate. The other target which is at a positive potential attracts any electrons or negative ions in the vicinity, repels the positive ions and becomes covered with a thin layer of the compound. On reversal of the potential on the targets, the previous anode becomes the cathode and the thin layer of compound is sputtered to the substrate after which the target is sputtered normally. To provide uniform sputtering with a moving substrate the two targets must be very close together. This results in the magnetic fields of the two magnet assemblies interfering with each other. Further, the magnetic field on the anodic target influences the motion of the electrons or negative ions, effectively increasing the impedance of the path to the anodic target and decreasing the efficiency of the anode.

According to the present invention the magnet assemblies of the two adjacent targets may be given identical novel motions described above, synchronised in such a way that the plasma race-tracks are always at the same distance apart. This keeps the magnetic interference to a minimum. Secondly the magnetic field from the magnet array according to the present invention only covers a portion of the target area at any one time. Hence, for the anodic target there is sufficient free target surface not influenced by the magnetic field to operate effectively as a getter for electrons and negative ions. According to the present invention parallelly arranged rectangular planar targets, each with an in-phase synchronised moving magnet assembly performing a motion according to the present invention can provide optimum performance during AC switching of the targets.

The magnet assembly 4 with the additional pieces 50 of ferromagnetic material described above is simple and effective in compensating for local excesses in target erosion. While the present invention has been shown and described with reference to preferred embodiments, it will be understood by those skilled in the art that various changes or modifications in form and detail may be made without departing from the scope and spirit of this invention. For instance, the skilled person will appreciate that the same novel effects could be obtained if the magnet assembly were stationary and the target is moved relative to the magnet assembly provided the ferromagnetic pieces according to the present invention are kept stationary with respect to the target. In addition the plasma race-track according to the present invention may be modified by using means known to the skilled person. For instance, the present invention includes a combination of ferromagnetic pieces with broadening the track width at the ends of the race-track according to the teachings of U.S. Pat. No. 5,364,518 or making the plasma race-track more pointed, triangular, elliptical or parabolic at its ends according to the teachings of WO 96/21750 or DE-A-27 07 144. Furthermore, one or more of the magnets of the magnet assembly according to the present invention may be inclined with respect to the plane of the target as disclosed in U.S. Pat. No. 5,130,005 (magnet 90) or may be provided with additional magnetic field shaping magnets according to the teachings of U.S. Pat. No. 5,364,518 (magnet 59) or U.S. Pat. No. 5,130,005 (magnets 90, 95).

What is claimed is:

1. A magnetron including a target for sputtering onto a substrate, the magnetron comprising:

a magnetic field generator for generating a closed loop magnetic field adapted to generate a plasma race-track above the target;

a driving device for establishing relative substantially translational movement between the race-track and the target; and one or more pieces of ferromagnetic material fixed with respect to the target and adapted to influence the magnetic field generated by the magnetic field generator at least during part of the relative substantially translational movement, there being a closest distance at any moment between a point on the race track and a part of the one or more pieces of ferromagnetic material, the closest distance varying in accordance with the relative substantially translational movement of the race-track and the target.

2. The magnetron according to claim 1, wherein the driving device for establishing relative, substantially translational movement generates a periodic movement.

3. The magnetron according to claim 2, wherein the driving device for establishing relative, substantially translational movement is adapted to generate the movement parallel to a surface of the target with a trace, the trace having a form of a two-dimensional figure.

4. The magnetron according to claim 3, wherein the one or more pieces of ferromagnetic material increase or decrease locally the magnetic field generated by the magnetic field generator.

5. The magnetron according to claim 2, wherein the one or more pieces of ferromagnetic material increase or decrease locally the magnetic field generated by the magnetic field generator.

6. The magnetron according to claim 1, wherein the one or more pieces of ferromagnetic material increase or decrease locally the magnetic field generated by the magnetic field generator.

7. The magnetron according to claim 1, wherein the relative substantially translational movement is one of repetitive re-entrant and repetitive non-re-entrant.

8. The magnetron according to claim 1 wherein the relative substantially translational movement is one of epitrochoidal, hypotrochoidal, hypocycloidal, circular and a Lissajous figure.

9. The magnetron according to claim 1, wherein the driving device keeps the race-track within at least a substantially central region of the target.

10. The magnetron according to claim 1, wherein the one or more pieces of ferromagnetic material vary in thickness.

11. The magnetron according to claim 1, wherein the target has a first surface and the magnetic field generator is positioned adjacent the first surface, the one or more pieces of ferromagnetic material are one or more pole pieces and the one or more pole pieces are located on a side of the magnetic field generator remote from the target.

12. The magnetron according to claim 1, wherein the target has a first surface and the magnetic field generator is positioned adjacent the first surface, the one or more pieces of ferromagnetic material are one or more pole pieces and the one or more pole pieces are located on a side of the magnetic field generator adjacent to the target.

13. The magnetron according to claim 1, wherein the magnetic field generator comprises one of an array of permanent magnets and an electromagnet.

14. A method of operating a magnetron having a target and a magnetic field generator, comprising the steps of:

generating a closed loop magnetic field using the magnetic field generator;

generating a plasma race-track above the target using the generated closed loop magnetic field;

moving the plasma race-track relative to the target in a relative, substantially translational movement; and locating one or more pieces of ferromagnetic material at positions stationary with respect to the target so that the magnetic field of the magnetic field generator is influenced at least during a part of the relative substantially translational movement, there being a closest distance at any moment between a point on the race track and a part of the one or more pieces of ferromagnetic material, the closest distance varying in accordance with the relative substantially translational movement of the race-track and the target.

15. The method according to claim 14, wherein the relative, substantially translational movement is a periodic movement.

16. The method according to claim 15, wherein the relative, substantially translational movement is parallel to a surface of the target with a trace, the trace having a form of a two-dimensional figure.

17. The method according to claim 16, wherein the one or more pieces of ferromagnetic material increases or decreases locally the magnetic field generated by the magnetic field generator.

18. The method according to claim 15, wherein the one or more pieces of ferromagnetic material increases or decreases locally the magnetic field generated by the magnetic field generator.

19. The method according to claim 14, wherein the one or more pieces of ferromagnetic material increases or decreases locally the magnetic field generated by the magnetic field generator.

20. A method of improving target erosion of a sputtering magnetron, the sputtering magnetron having a race-track generator which generates a race-track which moves relative to a target, comprising the steps of:

simulating an operation of the magnetron on a processing engine;

determining from the simulation local areas of the target with local deviations in target erosion;

simulating an effect of one or more pieces of ferromagnetic material fixed with respect to the target at locations neighbouring the local deviations in target erosion;

selecting a shape, thickness and material for the one or more pieces based on results of the simulation of the effect of one or more ferromagnetic pieces in order to reduce a degree of local deviation of target erosion.

21. A method of improving target erosion of a sputtering magnetron, the sputtering magnetron having a race-track generator which generates a plasma race-track which moves relative to a target, comprising the steps of:

inputting a description of the magnetron at a near location;

transmitting the description to a remote processing engine running a magnetron simulation program; and receiving at the near location descriptions of one or more pieces of ferromagnetic material as well as locations for fixing of these pieces stationary with respect to the target.

* * * * *